(12) United States Patent
Park

(10) Patent No.: US 10,359,475 B2
(45) Date of Patent: Jul. 23, 2019

(54) COMMON MODE NOISE SIMULATOR

(71) Applicant: LG CHEM, LTD., Seoul (KR)

(72) Inventor: Chanmin Park, Daejeon (KR)

(73) Assignee: LG CHEM, LTD., Seoul (KR)

( * ) Notice: Subject to any disclaimer, the term of this patent is extended or adjusted under 35 U.S.C. 154(b) by 204 days.

(21) Appl. No.: 15/510,179

(22) PCT Filed: Nov. 16, 2015

(86) PCT No.: PCT/KR2015/012302
§ 371 (c)(1),
(2) Date: Mar. 9, 2017

(87) PCT Pub. No.: WO2016/080720
PCT Pub. Date: May 26, 2016

(65) Prior Publication Data
US 2017/0307690 A1 Oct. 26, 2017

(30) Foreign Application Priority Data
Nov. 20, 2014 (KR) .......................... 10-2014-0162870

(51) Int. Cl.
*G01R 31/00* (2006.01)
*G01R 31/3832* (2019.01)
*G01R 31/36* (2019.01)
*G01R 31/12* (2006.01)
*G01R 31/14* (2006.01)
*G01R 31/382* (2019.01)
*G01R 31/02* (2006.01)

(52) U.S. Cl.
CPC ......... *G01R 31/3832* (2019.01); *G01R 31/12* (2013.01); *G01R 31/1227* (2013.01); *G01R 31/14* (2013.01); *G01R 31/36* (2013.01); *G01R 31/382* (2019.01); *G01R 31/025* (2013.01)

(58) Field of Classification Search
USPC .................................. 324/426, 429, 430, 433
See application file for complete search history.

(56) References Cited

U.S. PATENT DOCUMENTS

| 6,014,066 A * | 1/2000 | Harberts ................... H01P 1/15 257/735 |
| 6,151,228 A | 11/2000 | Miyazaki et al. |
| 2004/0227521 A1 | 11/2004 | Higashihama et al. |

(Continued)

FOREIGN PATENT DOCUMENTS

| CN | 1215246 A | 4/1999 |
| CN | 1279534 A | 1/2001 |

(Continued)

OTHER PUBLICATIONS

European Search Report for Appl. No. 15861068.3 dated Jun. 13, 2018.

(Continued)

*Primary Examiner* — Vincent Q Nguyen
(74) *Attorney, Agent, or Firm* — Birch, Stewart, Kolasch & Birch, LLP

(57) ABSTRACT

The present invention relates to a common mode noise simulator, and more particularly, to a common mode noise simulator which removes a high-frequency component by controlling impedance of an inductor, a capacitor, and a resistor and evaluates insulation performance of a battery by measuring leakage current of the battery depending on amplitude-modulated common mode noise.

6 Claims, 2 Drawing Sheets

(56) References Cited

U.S. PATENT DOCUMENTS

| | | | |
|---|---|---|---|
| 2005/0004482 A1 | 1/2005 | Drakulic | |
| 2010/0237872 A1 | 9/2010 | Kang et al. | |
| 2010/0253287 A1 | 10/2010 | Kim et al. | |
| 2012/0221266 A1* | 8/2012 | Kuroda | G01R 31/3641 702/63 |
| 2012/0299562 A1* | 11/2012 | Noda | H02M 3/1588 323/271 |
| 2014/0333321 A1 | 11/2014 | Kawamura et al. | |

FOREIGN PATENT DOCUMENTS

| | | |
|---|---|---|
| CN | 1499211 A | 5/2004 |
| CN | 1809314 A | 7/2006 |
| CN | 102047526 A | 5/2011 |
| CN | 203057075 U | 7/2013 |
| CN | 104136264 A | 11/2014 |
| EP | 2 336 794 B1 | 11/2014 |
| JP | 2012-181043 A | 9/2012 |
| KR | 20-2000-0005026 U | 3/2000 |
| KR | 10-2006-0087231 A | 8/2006 |
| KR | 10-2009-0041828 A | 4/2009 |
| KR | 10-0958795 B1 | 5/2010 |
| KR | 10-2014-0070148 A | 6/2014 |

OTHER PUBLICATIONS

International Search Report for PCT/KR2015/012302 dated Mar. 11, 2016.

* cited by examiner

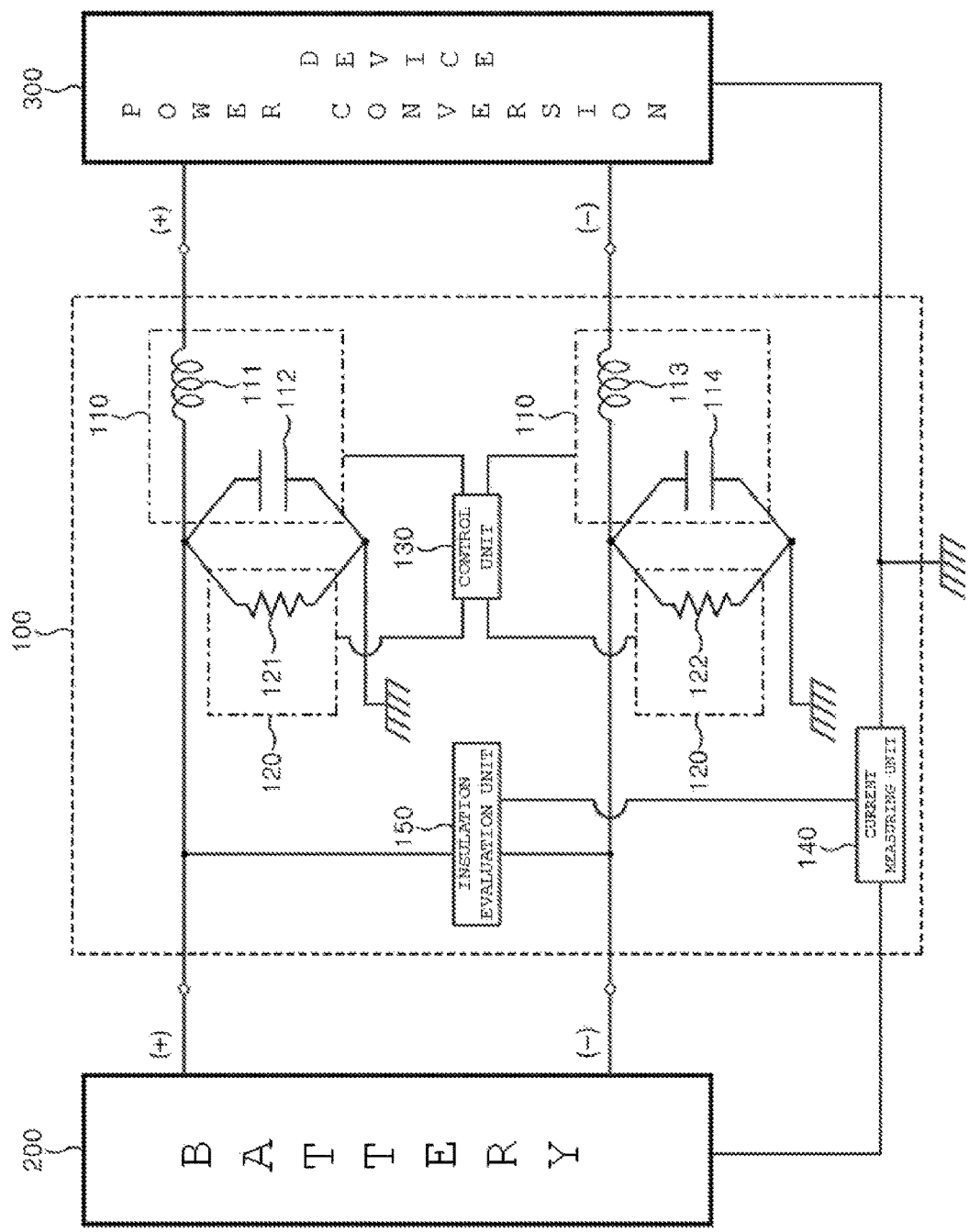
[FIG. 2]

COMMON MODE NOISE SIMULATOR

TECHNICAL FIELD

This application claims priority to and the benefit of Korean Patent Application No. 10-2014-0162870 filed in the Korean Intellectual Property Office on Nov. 20, 2014, the entire contents of which are incorporated herein by reference.

The present invention relates to a common mode noise simulator, and more particularly, to a common mode noise simulator which removes a high-frequency component by controlling impedance of an inductor, a capacitor, and a resistor and evaluates insulation performance of a battery by measuring leakage current of the battery depending on amplitude-modulated common mode noise (CMN).

BACKGROUND ART

An energy storage system (ESS) installed in a power plant driving a large-scale power network and a building having large power consumption may be generally configured to include a battery rack constituted by multiple battery modules, and consequently, numerous batteries may be collected and installed in a special space such as an air-conditioning building or container. In this case, a battery management system (BMS) is installed in the battery module and the battery rack for monitoring and controlling control targets including voltage, current, a temperature, a breaker, and the like.

Meanwhile, a power conversion system (PCS) installed in the energy storage system controls power supplied from the outside and power supplied from the battery rack to the outside to control charging/discharging of the battery rack and the energy management system (EMS) connected with the power conversion system controls an output of the power conversion system based on monitoring and control results of the battery management system.

That is, the energy storage system monitors and controls the battery rack through the battery management system in real time in order to enhance power efficiency of the battery rack and diagnose and prevent an obstacle which may occur in a high-output environment and controls the output of the power conversion system through the energy management system based on the monitored and controlled battery rack to control charging/discharging the battery rack.

As a result, it is important that communication using a signal is stably performed among the battery rack, the battery management system, the energy management system, and the power conversion system in the energy storage system and to this end, a countermeasure for conduction noise which is induced into the energy storage system to cause a communication failure and malfunction is required.

A transfer mode of the conduction noise includes two modes of a differential mode and a common mode and a noise countermeasure depending on a difference varies. In particular, since common mode noise induced through the common mode is generated by an imbalance of impedance of a wiring system, and the like and becomes remarkable at a higher frequency and transferred to a ground surface, and the like to return while forming a large loop, the common mode noise causes various communication failures even to a far-off electronic apparatus, and as a result, a countermeasure for the common mode noise becomes important.

Occurrence frequencies of the communication failure and the malfunction caused due to the common mode noise induced to the energy storage system are reduced as the insulation performance of the battery rack is excellent, and as a result, development of a common mode noise simulator for evaluating the insulation performance of the battery rack depending on the common mode noise is required.

Therefore, the present inventor has invented a common mode noise simulator which removes a high-frequency component by controlling impedance of an inductor, a capacitor, and a resistor and evaluates insulation performance of a battery by measuring leakage current of the battery depending on amplitude-modulated common mode noise.

DETAILED DESCRIPTION OF THE INVENTION

Technical Problem

An object of the present invention is to provide a common mode noise simulator which can remove a high-frequency component with a set range by controlling impedance of at least one of a first inductor, a second inductor, a first capacitor, and a second capacitor included in a high frequency removing unit from common mode noise.

Further, another object of the present invention is to provide a common mode noise simulator which can control an amplitude of the common mode noise within a set amplitude modulation range by controlling the impedance of at least one of a first resistor and a second resistor included in an amplitude modulation unit.

In addition, yet another object of the present invention is to provide a common mode noise simulator which can evaluate insulation performance of a battery based on waveform information of the common mode noise which is induced to a battery as the high-frequency component is removed and the amplitude is modulated and waveform information of leakage current of the battery.

Technical Solution

According to an embodiment of the present invention, a common mode noise simulator is configured to include: a high frequency removing unit removing a high-frequency component of common mode noise induced from a power conversion system controlling charging/discharging a battery and a ground; an amplitude modulating unit modulating an amplitude of the common mode noise; and an insulation evaluating unit evaluating insulation performance of the battery based on waveform information of the common mode noise which is induced to the battery as the high-frequency component is removed through the high frequency removing unit and the amplitude is modulated through the amplitude modulating unit and waveform information of leakage current of the battery.

The high frequency removing unit may include a first inductor connected between an anode terminal of the battery and an anode terminal of the power conversion device, and a first capacitor connected between the anode terminal of the power conversion device and the ground.

The high frequency removing unit may further include a second inductor connected between a cathode terminal of the battery and a cathode terminal of the power conversion device, and a second capacitor connected between the cathode terminal of the power conversion device and the ground.

The amplitude modulating unit may include a first resistor connected between the anode terminal of the power conversion device and the ground.

The amplitude modulating unit may further include a second resistor connected between the cathode terminal of the power conversion device and the ground.

The common mode noise simulator may further include a control unit controlling impedance of at least one of the first inductor, the second inductor, the first capacitor, and the second capacitor to set a range of the high-frequency component removed from the common mode noise.

The control unit may control the impedance of at least one of the first resistor and the second resistor to set an amplitude modulation range of the common mode noise.

The insulation evaluating unit may compare a current value of the leakage current and a predetermined current value corresponding to waveform information of the common mode noise induced to the battery and determine that the insulation performance of the battery is excellent when the current value of the leakage current is equal to or less than the predetermined current value.

The common mode noise simulator may further include a current measuring unit measuring the leakage current of the battery.

Advantageous Effects

A common mode noise simulator according to an embodiment of the present invention evaluates insulation performance of a battery based on waveform information of the common mode noise which is induced to a battery as the high-frequency component is removed and the amplitude is modulated and waveform information of leakage current of the battery to save quality management cost after releasing the battery.

BRIEF DESCRIPTION OF DRAWINGS

FIG. 2 is a diagram illustrating one example of a detailed configuration of the common mode noise simulator according to the embodiment of the present invention.

BEST MODE

Figure 1:
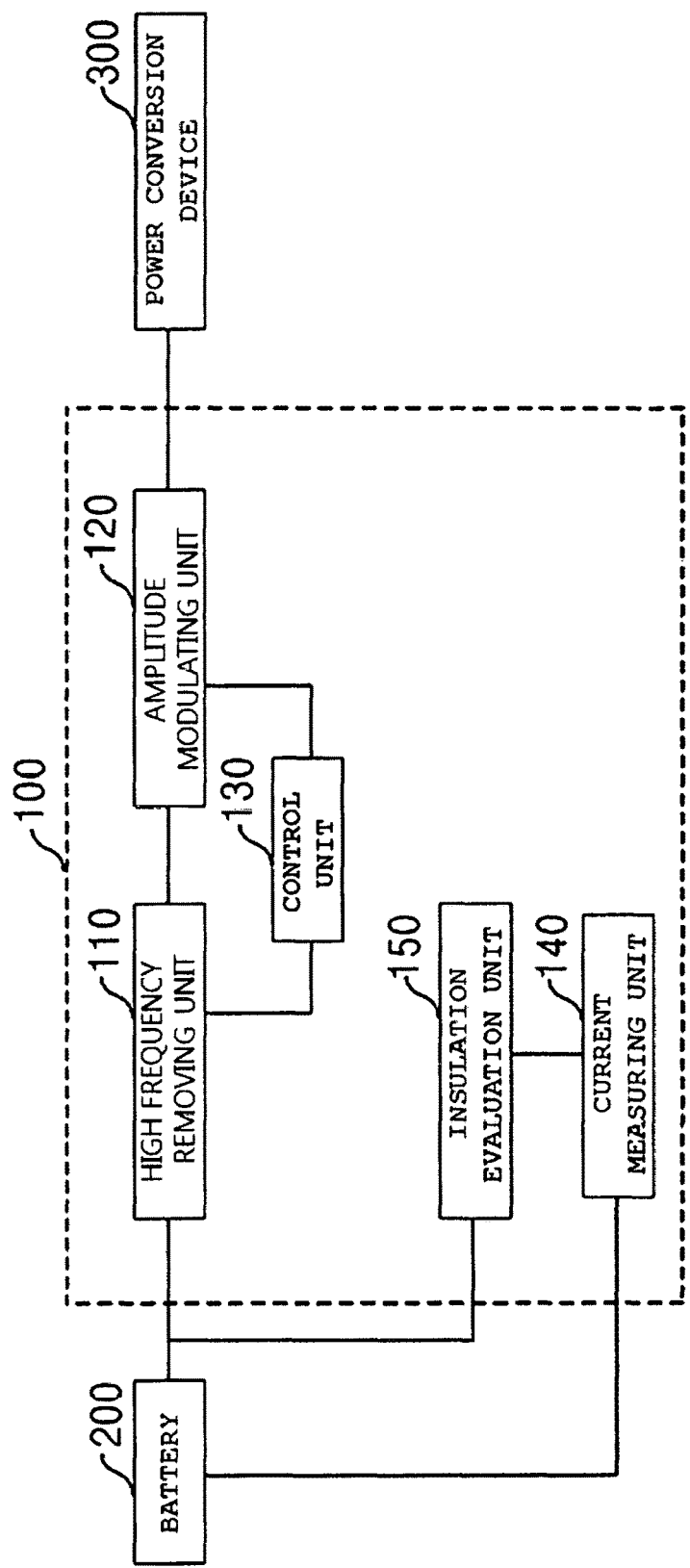
FIG. 1 is a block diagram illustrating a configuration of a common mode noise simulator according to an embodiment of the present invention.

The present invention will be described below in detail with reference to the accompanying drawings. Herein, a repeated description a detailed description of a known function and a known constitution which may unnecessarily obscure the spirit of the present invention will be skipped. The embodiment of the present invention is provided to more completely describe the present invention to those skilled in the art. Accordingly, the shape, the size, etc., of elements in the figures may be exaggerated for more explicit comprehension.

Throughout the specification, unless explicitly described to the contrary, the word "comprise" and variations such as "comprises" or "comprising", will be understood to imply the inclusion of stated elements but not the exclusion of any other elements.

In addition, the term "unit" disclosed in the specification means a unit that processes at least one function or operation and this may be implemented by hardware or software or a combination of hardware and software.

FIG. 1 is a block diagram illustrating a configuration of a common mode noise simulator according to an embodiment of the present invention and FIG. 2 is a diagram illustrating one example of a detailed configuration of the common mode noise simulator according to the embodiment of the present invention.

Referring to FIGS. 1 and 2, a common mode noise simulator 100 may be configured to include a high frequency removing unit 110, an amplitude modulating unit 120, a control unit 130, a current measuring unit 140, and an insulation evaluating unit 150. The common mode noise simulator 100 illustrated in FIGS. 1 and 2 is based on an embodiment and the components are not limited to the embodiment illustrated in FIGS. 1 and 2 and may be added, changed, or deleted as necessary.

The common mode noise simulator 100 is provided between a battery 200 included in an energy storage system (ESS) and a power conversion system (PCS) 300 to serve to remove a high-frequency component of common mode noise induced to the battery 200 or modulate the amplitude of the common mode noise in the power conversion device 300 and a ground.

Further, the common mode noise simulator 100 may serve to evaluate insulation performance of the battery by measuring leakage current from the battery to which the common mode noise in which the high-frequency component is removed and the amplitude is modulated is induced.

The high frequency removing unit 110 may serve to remove the high-frequency component of the common mode noise induced from the power conversion device 300 and the ground.

To this end, the high frequency removing unit 110 may include a first inductor 111 connected between an anode terminal of the battery 200 and the anode terminal of the power conversion device 300 and a first capacitor 112 connected between the anode terminal of the power conversion device 300 and the ground.

The first inductor 111 and the first capacitor 112 of the high frequency removing unit 110 may remove the high-frequency component of the common mode noise induced from the anode terminal of the power conversion device 300 and the ground.

Further, the high frequency removing unit 110 may include a second inductor 113 connected between an anode terminal of the battery 200 and the anode terminal of the power conversion device 300 and a second capacitor 114 connected between the anode terminal of the power conversion device 300 and the ground.

The second inductor 113 and the second capacitor 114 of the high frequency removing unit 110 may remove the high-frequency component of the common mode noise induced from a cathode terminal of the power conversion device 300 and the ground.

In this case, in order to remove the high-frequency component within a predetermined range from the common mode noise, impedance of at least one of the first inductor 111, the first capacitor 112, the second inductor 113, and the second capacitor 114 of the high frequency removing unit 110 may be controlled by a control unit to be described below.

The amplitude modulating unit 120 may serve to modulate the amplitude of the common mode noise induced from the power conversion device 300 and the ground.

To this end, the amplitude modulating unit 120 may include a first resistor 121 connected between the anode terminal of the power conversion device 300 and the ground.

The first resistor 121 of the amplitude modulating unit 120 may modulate the amplitude of the common mode noise induced from the anode terminal of the power conversion device 300 and the ground and removed with the high-frequency component through the high frequency removing unit 110.

Further, the amplitude modulating unit 120 may include a second resistor 122 connected between the cathode terminal of the power conversion device 300 and the ground.

The second resistor 122 of the amplitude modulating unit 120 may modulate the amplitude of the common mode noise induced from the cathode terminal of the power conversion device 300 and the ground and removed with the high-frequency component through the high frequency removing unit 110.

In this case, in order to modulate the amplitude of the common mode noise within a predetermined range, the impedance of at least one of the first resistor 121 and the second resistor 122 of the amplitude modulating unit 120 may be controlled by the control unit described below.

The control unit 130 controls the impedance of at least one of the first inductor 111, the first capacitor 112, the second inductor 113, and the second capacitor 114 of the high frequency removing unit 110 to set the range of the high-frequency component removed from the common mode noise.

Herein, the predetermined range may be a frequency range of the common mode noise which has a high frequency band to cause the communication failure and the malfunction among the battery, the power conversion device, the battery management system (BMS), and the energy management system (EMS) included in the energy storage system.

Further, the impedance of the first inductor 111 and the second inductor 113 may be inductance of an inductor element and the impedance of the first capacitor 112 and the second capacitor 114 may be conductance of a capacitor element.

The control unit 130 controls the impedance of at least one of the first resistor 121 and the second resistor 121 of the high frequency removing unit 110 to set an amplitude modulation range of the common mode noise.

Herein, the amplitude may be peak voltage or peak to peak voltage of the common mode noise.

The control unit 130 controls at least one impedance of the amplitude modulating unit 120 to set the amplitude modulation range of the common mode noise.

Herein, the amplitude may be the peak voltage or peak to peak voltage of the common mode noise.

Further, the impedance of the first resistor 121 and the second resistor 122 may be a resistance value of a variable resistor element and the control unit 130 may control the impedance of the first resistor 121 and the second resistor 122 by changing the resistance value of the variable resistor.

Meanwhile, the common mode noise in which the high-frequency component is removed and the amplitude is modulated through the high frequency removing unit 110 and the amplitude modulating unit 120 may be induced to the battery 200 and the leakage current of the battery 200 may vary depending on the induced common mode noise and the insulation performance of the battery 200.

In this case, the current measuring unit 140 is connected between the battery 200 and the ground in series to serve to measure the leakage current which leaks from the battery 200. Further, the current measuring unit 140 may transmit the measured leakage current to the control unit 150 to be described below as a signal of a waveform.

The current measuring unit 140 that performs the role may use a current sensor corresponding to at least one of a current transformer type, a hall element type, and a fuse type in order to measure the leakage current of the battery 200 and include at least one switch element, capacitor, conducting wire, and the like and further include a stabilizer (for example, a resistor having a high resistance value, and the like) (not illustrated) for protecting the inside from high current.

The insulation evaluating unit 150 may serve to evaluate the insulation performance of the battery 200 based on waveform information of the common mode noise which is induced to the battery 200 as the high-frequency component is removed through the high frequency removing unit 110 and the amplitude is modulated through the amplitude modulating unit 120 and waveform information of the leakage current of the battery 200, which is measured through the current measuring unit 140.

In more detail, the insulation evaluating unit 150 may compare a predetermined current value corresponding to the waveform information of the common mode noise induced to the battery 200 and a current value of the leakage current of the battery 200 and determine that the insulation performance of the battery 200 is excellent when the leakage current value is equal to or less than the predetermined current value.

Herein, the current value of the leakage current may be peak voltage or peak to peak voltage of the waveform of the leakage current.

Further, the predetermined current value may be the waveform information of the common mode noise induced to the battery 200, that is, an allowable leakage current value of the battery 200 depending on the peak voltage or the peak to peak voltage.

The present invention has been described with reference to the preferred embodiments of the present invention. However, it will be appreciated by those skilled in the art that various modifications and changes of the present invention can be made without departing from the spirit and the scope of the present invention which are defined in the appended claims and their equivalents.

The invention claimed is:

1. A common mode noise simulator comprising:
a high frequency removing unit removing a high-frequency component of common mode noise (CMN) induced from a power conversion system (PCS) controlling charging/discharging a battery and a ground;
an amplitude modulating unit modulating an amplitude of the common mode noise; and
an insulation evaluating unit evaluating insulation performance of the battery based on waveform information of the common mode noise which is induced to the battery as the high-frequency component is removed through the high frequency removing unit, the amplitude is modulated through the amplitude modulating unit and waveform information of leakage current of the battery,
wherein the high frequency removing unit includes:
a first inductor connected between an anode terminal of the battery and an anode terminal of the power conversion device,
a first capacitor connected between the anode terminal of the power conversion device and the ground,
a second inductor connected between a cathode terminal of the battery and a cathode terminal of the power conversion device, and
a second capacitor connected between the cathode terminal of the power conversion device and the ground, and
wherein the common mode noise simulator further comprises a control unit controlling impedance of at least one of the first inductor, the second inductor, the first capacitor, and the second capacitor to set a range of the high-frequency component removed from the common mode noise.

2. The common mode noise simulator of claim 1, wherein the amplitude modulating unit includes a first resistor connected between the anode terminal of the power conversion device and the ground.

3. The common mode noise simulator of claim 2, wherein the amplitude modulating unit further includes a second resistor connected between the cathode terminal of the power conversion device and the ground.

4. The common mode noise simulator of claim 3, wherein the control unit controls the impedance of at least one of the first resistor and the second resistor to set an amplitude modulation range of the common mode noise.

5. The common mode noise simulator of claim 4, wherein the insulation evaluating unit compares a current value of the leakage current and a predetermined current value corresponding to waveform information of the common mode noise induced to the battery and determines that the insulation performance of the battery is excellent when the current value of the leakage current is equal to or less than the predetermined current value.

6. The common mode noise simulator of claim 1, further comprising:
   a current measuring unit measuring the leakage current of the battery.

* * * * *